(12) United States Patent
Caliendo et al.

(10) Patent No.: US 7,550,749 B2
(45) Date of Patent: *Jun. 23, 2009

(54) METHODS AND PROCESSING SYSTEMS FOR USING A GAS CLUSTER ION BEAM TO OFFSET SYSTEMATIC NON-UNIFORMITIES IN WORKPIECES PROCESSED IN A PROCESS TOOL

(75) Inventors: Steve Caliendo, Ashby, MA (US); Nicholas J. Hofmeester, Danvers, MA (US)

(73) Assignee: TEL Epion Inc., Billerica, MA (US)

( * ) Notice: Subject to any disclaimer, the term of this patent is extended or adjusted under 35 U.S.C. 154(b) by 341 days.

This patent is subject to a terminal disclaimer.

(21) Appl. No.: 11/694,572

(22) Filed: Mar. 30, 2007

(65) Prior Publication Data

US 2008/0237492 A1    Oct. 2, 2008

(51) Int. Cl.
G21K 5/04 (2006.01)
G21K 5/10 (2006.01)

(52) U.S. Cl. .............. 250/492.21; 250/492.3; 204/192.1; 204/192.3; 204/192.34; 257/583

(58) Field of Classification Search .......... 250/492.1, 250/492.2, 492.3, 492.21; 257/E21.525, 257/E21.582, E21.583; 204/192.1, 192.3, 204/192.4

See application file for complete search history.

(56) References Cited

U.S. PATENT DOCUMENTS

| | | | |
|---|---|---|---|
| 6,486,478 B1 * | 11/2002 | Libby et al. ............. 250/492.1 |
| 6,537,606 B2 | 3/2003 | Allen et al. |
| 6,646,277 B2 * | 11/2003 | Mack et al. ............. 250/492.21 |
| 6,737,643 B2 * | 5/2004 | Torti et al. .................. 250/288 |
| 6,831,272 B2 | 12/2004 | Mack et al. |
| 7,060,988 B2 | 6/2006 | Mack et al. |
| 7,067,828 B2 | 6/2006 | Swenson |
| 7,115,511 B2 | 10/2006 | Hautala |
| 7,173,252 B2 | 2/2007 | Mack |
| 7,420,189 B2 * | 9/2008 | Imamura et al. ........ 250/492.21 |
| 2002/0130275 A1 * | 9/2002 | Mack et al. .............. 250/492.1 |
| 2007/0117342 A1 * | 5/2007 | Chen et al. ................. 438/401 |
| 2008/0048132 A1 * | 2/2008 | Gwinn et al. ............ 250/492.3 |
| 2008/0237491 A1 * | 10/2008 | Caliendo et al. ........ 250/492.3 |
| 2008/0237492 A1 * | 10/2008 | Caliendo et al. ........ 250/492.3 |
| 2009/0032725 A1 * | 2/2009 | Hautala ...................... 250/400 |
| 2009/0057574 A1 * | 3/2009 | Wagner et al. ......... 250/492.21 |

FOREIGN PATENT DOCUMENTS

| | | |
|---|---|---|
| WO | 0106538 A1 | 1/2001 |
| WO | 0205315 A2 | 1/2002 |
| WO | 02052608 A2 | 7/2002 |

OTHER PUBLICATIONS

Yamada, et al., Surface Processing by Gas Cluster Ion Beams at the Atomic (Molecular) Level), J. Vac. Sci. Technol. A 14(3), May/Jun. 1996 (5 pages).

European Patent Office, International Search Report issued in corresponding PCT Application serial No. PCT/US2008/058222 dated Aug. 11, 2008 (3 pages).

* cited by examiner

Primary Examiner—Bernard E Souw
(74) Attorney, Agent, or Firm—Wood, Herron & Evans, LLP (57) ABSTRACT

Embodiments of an apparatus and methods for offsetting systematic non-uniformities using a gas cluster ion beam are generally described herein. Other embodiments may be described and claimed.

25 Claims, 4 Drawing Sheets

METHODS AND PROCESSING SYSTEMS FOR USING A GAS CLUSTER ION BEAM TO OFFSET SYSTEMATIC NON-UNIFORMITIES IN WORKPIECES PROCESSED IN A PROCESS TOOL

FIELD OF THE INVENTION

The field of invention relates generally to the field of semiconductor integrated circuit manufacturing and, more specifically but not exclusively, relates to methods and processing systems for using a gas cluster ion beam to offset systematic non-uniformities in workpieces processed using a process tool.

BACKGROUND OF THE INVENTION

Gas-cluster ion beams (GCIB's) are used for etching, cleaning, smoothing, and forming thin films. For purposes of this discussion, gas clusters are nano-sized aggregates of materials that are gaseous under conditions of standard temperature and pressure. Such gas clusters may consist of aggregates including a few to several thousand molecules, or more, that are loosely bound together. The gas clusters can be ionized by electron bombardment, which permits the gas clusters to be formed into directed beams of controllable energy. Such cluster ions each typically carry positive charges given by the product of the magnitude of the electronic charge and an integer greater than or equal to one that represents the charge state of the cluster ion.

The larger sized cluster ions are often the most useful because of their ability to carry substantial energy per cluster ion, while yet having only modest energy per individual molecule. The ion clusters disintegrate on impact with the workpiece. Each individual molecule in a particular disintegrated ion cluster carries only a small fraction of the total cluster energy. Consequently, the impact effects of large ion clusters are substantial, but are limited to a very shallow surface region. This makes gas cluster ions effective for a variety of surface modification processes, but without the tendency to produce deeper subsurface damage that is characteristic of conventional ion beam processing.

Conventional cluster ion sources produce cluster ions having a wide size distribution scaling with the number of molecules in each cluster that may reach several thousand molecules). Clusters of atoms can be formed by the condensation of individual gas atoms (or molecules) during the adiabatic expansion of high-pressure gas from a nozzle into a vacuum. A skimmer with a small aperture strips divergent streams from the core of this expanding gas flow to produce a collimated beam of clusters. Neutral clusters of various sizes are produced and held together by weak interatomic forces known as Van der Waals forces. This method has been used to produce beams of clusters from a variety of gases, such as helium, neon, argon, krypton, xenon, nitrogen, oxygen, carbon dioxide, sulfur hexafluoride, nitric oxide, nitrous oxide, and mixtures of these gases.

Several emerging applications for GCIB processing of workpieces on an industrial scale are in the semiconductor field. Although GCIB processing of workpieces is performed using a wide variety of gas-cluster source gases, many of which are inert gases, many semiconductor processing applications use reactive source gases, sometimes in combination or mixture with inert or noble gases, to form the GCIB.

Although GCIB processing may be used to correct for variations in an upper layer of a workpiece by etching, cleaning, smoothing, or deposition, conventional GCIB processing apparatus and methods do not alleviate non-uniformities in an upper layer of the workpiece caused by process anomalies intrinsic to a particular process tool.

BRIEF DESCRIPTION OF THE DRAWINGS

The present invention is illustrated by way of example and not as a limitation in the figures of the accompanying drawings.

DETAILED DESCRIPTION

There is a general need for offsetting systematic non-uniformities inherent to many process tools, such as a single or a combination of process tools used in a semiconductor fabrication facility. One way to offset systematic non-uniformities is to use a gas cluster ion beam (GCIB) upstream from a process tool to either selectively remove material from a workpiece or selectively add material to a workpiece. By using a GCIB to offset systematic non-uniformities, a more repeatable and constant process may be produced resulting in improved output parameters, such as device or circuit characteristics. The systematic non-uniformities are manifested in an upper layer of a substrate or workpiece that may comprise a layer or film of a material carried on the substrate or workpiece, surface roughness, or surface contamination. The GCIB may etch, clean, or smooth the upper layer or may deposit material on the upper layer for purposes of offsetting the systematic non-uniformities in the upper layer.

Figure 1:
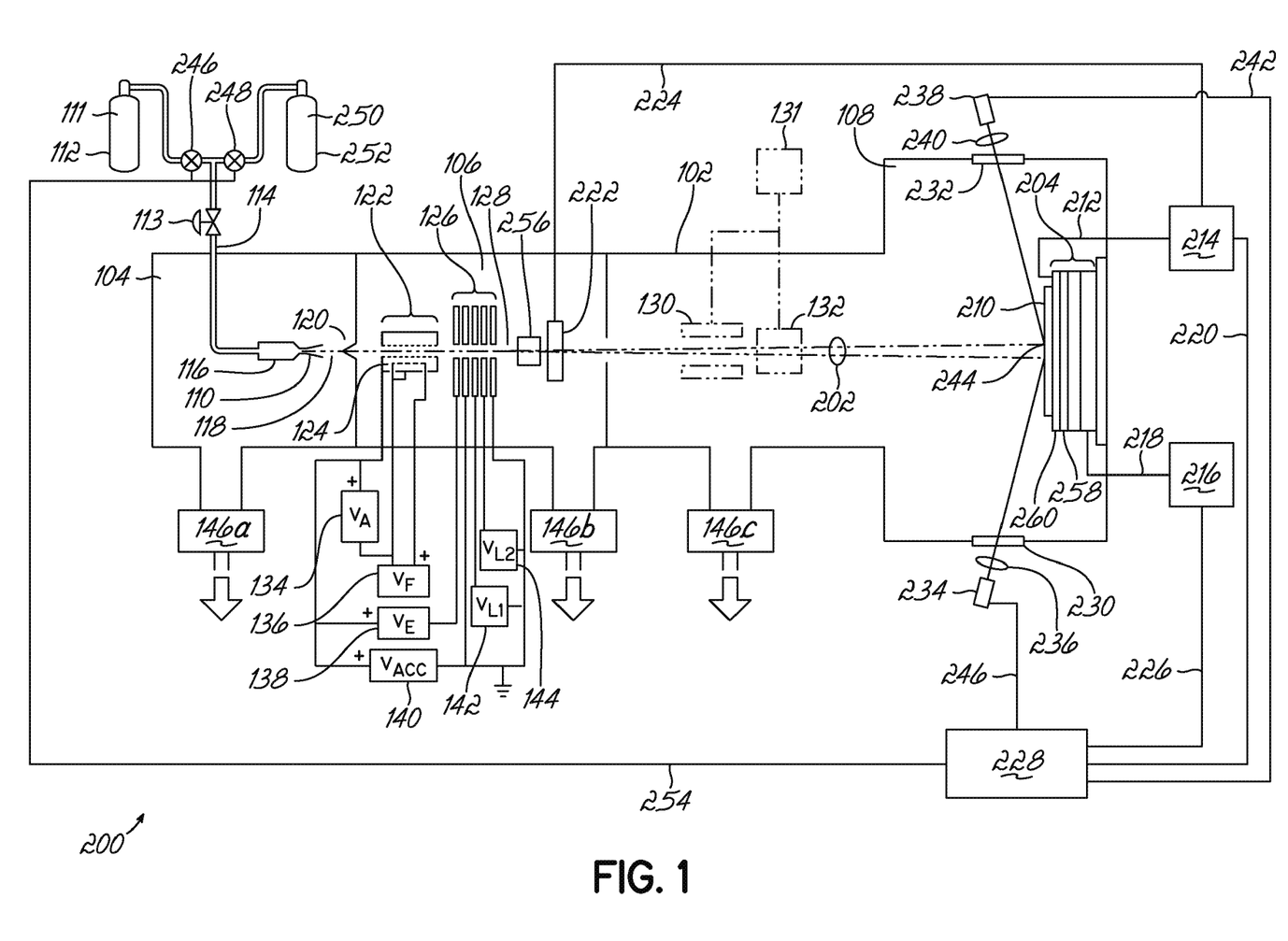
FIG. 1 is a diagrammatic view of a GCIB processing apparatus.

With reference to FIG. 1, a GCIB processing apparatus 200 includes a vacuum vessel 102 divided into communicating chambers that include a source chamber 104, an ionization/acceleration chamber 106, and a processing chamber 108 separated from the source chamber 104 by the ionization/acceleration chamber 106. The chambers 104, 106, 108 are evacuated to suitable operating pressures by vacuum pumping systems 146a, 146b, and 146c, respectively. A condensable source gas 112 (for example, argon (Ar), carbon dioxide ($CO_2$), oxygen ($O_2$), or nitrogen ($N_2$)) stored in a source gas cylinder 111 is admitted under pressure through a gas metering valve 113 and a gas feed tube 114 into a stagnation chamber 116. The source gas is subsequently ejected from the stagnation chamber 116 into the substantially lower pressure vacuum inside the source chamber 104 through a properly shaped nozzle 110. A gas jet 118 results inside the source chamber 104. Cooling, which results from the rapid expansion of the jet 118, causes a portion of the gas jet 118 to condense into clusters, each consisting of from several to several thousand weakly bound atoms or molecules.

A gas skimmer aperture 120 situated between the source chamber 104 and ionization/acceleration chamber 106 partially separates any gas molecules that have not condensed into clusters from those that have condensed and become part of the gas jet 118. The removal of the un-condensed gas molecules minimizes pressure increases in the downstream regions where such higher pressures would be detrimental, such as in the ionization/acceleration chamber 106 near ionizer 122 and high voltage electrodes 126 and in the process chamber 108.

After the gas jet 118 has been formed in the source chamber 104, the constituent gas clusters in gas jet 118 are ionized by ionizer 122. The ionizer 122 is typically an electron impact ionizer that produces electrons from one or more filaments 124 and accelerates and directs the electrons causing them to collide with the gas clusters in the gas jet 118 inside the ionization/acceleration chamber 106. The electron impact ejects electrons from molecules in the gas clusters to generate ionized molecules and thereby endows the gas clusters with a net positive charge to define cluster ions. A filament power supply 136 provides voltage $V_F$ to heat the ionizer filament 124.

A set of suitably biased high voltage electrodes 126 in the ionization/acceleration chamber 106 extracts the cluster ions from the ionizer 122. The high voltage electrodes 126 then accelerate the extracted cluster ions to a desired energy and focus them to define the GCIB 128. The kinetic energy of the cluster ions in GCIB 128 typically ranges from 1 thousand electron volts (keV) to several tens of keV. Anode power supply 134 provides voltage $V_A$ to at least one of the high voltage electrodes 126 for accelerating electrons emitted from filament 124 and causing the electrons to bombard the gas clusters in gas jet 118, which produces cluster ions.

Extraction power supply 138 provides voltage $V_E$ to bias at least one of the high voltage electrodes 126 to extract ions from the ionizing region of ionizer 122 and to form the GCIB 128. Accelerator power supply 140 provides voltage $V_{Acc}$ to bias one of the high voltage electrodes 126 with respect to the ionizer 122 so as to result in a total GCIB acceleration energy equal to $V_{Acc}$ electron volts (eV). Lens power supplies 142, 144 may be provided to bias some of the high voltage electrodes 126 with potentials (e.g., $V_{L1}$ and $V_{L2}$) to focus the GCIB 128. A beam filter 256 in the ionization/acceleration chamber 106 eliminates monomers or monomers and light cluster ions from the GCIB 128 to define a GCIB 202 that enters the processing chamber 108.

A beam gate 222 is disposed in the path of GCIB 128 in the ionization/acceleration chamber 106. Beam gate 222 has an open state in which the GCIB 128 is permitted to pass from the ionization/acceleration chamber 106 to the processing chamber 108 to define GCIB 202 and a closed state in which the GCIB 128 is blocked from entering the processing chamber 108. A control cable 224 conducts control signals from dosimetry processor 214 to beam gate 222. The control signals controllably switch beam gate 222 to between the open or closed states.

A workpiece 210, which may be a semiconductor wafer or other substrate to be processed by GCIB processing, is disposed in the path of the GCIB 202 in the processing chamber 108. Because most applications contemplate the processing of large workpieces 210 with spatially uniform results, a scanning system may be desirable to uniformly scan the GCIB 202 across large areas to produce spatially homogeneous results.

The GCIB 202 directed at the workpiece 210 may be substantially stationary (i.e., un-scanned). Workpiece 210 is held in the processing chamber 108 on a X-Y positioning table 204 operable to move the workpiece 210 in two axes, effectively scanning the workpiece 210 relative to the GCIB 202. The GCIB 202 impacts the workpiece 210 at a projected impact region 244 on a surface of the workpiece 210. By X-Y motion, the X-Y positioning table 204 can position each portion of a surface of the workpiece 210 in the path of GCIB 202 so that every region of the surface may be made to coincide with the projected impact region 244 for processing by the GCIB 202. An X-Y controller 216 provides electrical signals to the X-Y positioning table 204 through an electrical cable 218 for controlling the position and velocity in each of X-axis and Y-axis directions. The X-Y controller 216 receives control signals from, and is operable by, system controller 228 through an electrical cable 226. X-Y positioning table 204 moves by continuous motion or by stepwise motion according to conventional X-Y table positioning technology to position different regions of the workpiece 210 within the projected impact region 244. In one embodiment, X-Y positioning table 204 is programmably operable by the system controller 228 to scan, with programmable velocity, any portion of the workpiece 210 through the projected impact region 244 for GCIB processing by the GCIB 202.

Alternatively, orthogonally oriented electrostatic scan plates 130, 132 can be utilized to produce a raster or other scanning pattern of the GCIB 202 across the desired processing area on workpiece 210, instead of or in addition to using positioning table 204. When beam scanning is performed, a scan generator 131 provides X-axis and Y-axis scanning signal voltages to the scan plates 130, 132. The scanning signal voltages are commonly triangular waves of different frequencies that cause the GCIB 202 to scan the entire surface of workpiece 210.

The workpiece holding surface 260 of positioning table 204 is electrically conductive and is connected to a dosimetry processor 214 by an electrical lead 212. An electrically insulating layer 258 of positioning table 204 isolates the workpiece 210 and workpiece holding surface 260 from the other portions of the positioning table 204. Electrical charge induced in the workpiece 210 by the impinging GCIB 202 is conducted through workpiece 210, workpiece holding surface 260, and electrical lead 212 to the dosimetry processor 214 for measurement. Dosimetry processor 214 has integrating means for integrating the GCIB current to determine a GCIB processing dose. Under certain circumstances, a target-neutralizing source (not shown) of electrons, sometimes referred to as electron flood, may be used to neutralize the GCIB 202. In such case, a Faraday cup (not shown) may be used to assure accurate dosimetry despite the added source of electrical charge.

The processing chamber 108 includes optical windows 230 and 232. An optical transmitting transducer 234, which may also have additional transmitting optics 236, and an optical receiving transducer 238, which may also have additional receiving optics 240, form a conventional optical instrumentation system. The transmitting transducer 234 receives, and is responsive to, controlling electrical signals from the system controller 228 communicated through an electrical cable 246. The transmitting transducer 234 directs an optical beam through the optical window 230 toward the workpiece 210. The receiving transducer 238 detects the optical beam through optical window 232. The receiving transducer 238 sends measurement signals to the system controller 228 through an electrical cable 242.

The optical instrumentation system may comprise any of a variety of different instruments for tracking the progress of the GCIB processing. For example, the optical instrumentation system may constitute a spectroscopic ellipsometry system for measuring or mapping the thickness of the upper film layer on the workpiece 210. As another example, the optical instrumentation system may comprise a scatterometer for measuring or mapping the thickness of the layer on the workpiece surface. By operating under control of the system controller 228 and in conjunction with the X-Y positioning table 204, the optical instrumentation can map one or more characteristics of the workpiece 210.

In addition to gas cylinder 112, the GCIB processing apparatus 200 has a second gas cylinder 250 for containing a reactive gas 252, that may be, for example, oxygen, nitrogen, carbon dioxide, nitric oxide, nitrous oxide, another oxygen-containing condensable gas, or sulfur hexafluoride. Shut-off valves 246 and 248 are operable by signals transmitted through electrical cable 254 by system controller 228 to select either source gas 112 or source gas 252 for GCIB processing.

The dosimetry processor 214 may be one of many conventional dose control circuits that are known in the art and may include, as a part of its control system, all or part of a programmable computer system. The X-Y controller 216 may include as part of its logic all, or part of, a programmable computer system. The dosimetry processor 214 may include as part of its logic all, or part of, a programmable computer system. Some or all of the logic of the X-Y controller 216 and dosimetry processor 214 may be performed by a small general purpose computer that also controls other portions of the GCIB processing apparatus, including the system controller 228.

In operation, the dosimetry processor 214 signals the opening of the beam gate 222 to irradiate the workpiece 210 with the GCIB 202. The dosimetry processor 214 measures the GCIB current collected by the workpiece 210 to compute the accumulated dose received by the workpiece 210. When the dose received by the workpiece 210 reaches a predetermined required dose, the dosimetry processor 214 closes the beam gate 222 and processing of the workpiece 210 is complete.

The dosimetry processor 214 is electrically coupled with the system controller 228 by an electrical cable 220. During processing of the workpiece 210, the dose rate is communicated by the dosimetry processor 214 to the system controller 228 by electrical signals transmitted over electrical cable 220. The system controller 228 analyzes the electrical signals to, for example, confirming that the GCIB beam flux is substantially constant or to detect variations in the GCIB beam flux. The X-Y controller 216 is responsive to electrical signals from the system controller 228 that are transmitted over an electrical cable 226. The X-Y controller 216 can scan the X-Y positioning table to position every part of the workpiece 210 for processing according to predetermined velocities that result appropriate beam dwell times to etch material or to deposit material to the desired local thicknesses effective to provide a film of substantially uniform thickness.

As an alternative method, the GCIB beam 202 may be scanned at a constant velocity in a fixed pattern across the surface of the workpiece 210, but the GCIB intensity is modulated (often referred to as Z-axis modulation) to deliver an intentionally non-uniform dose to the sample. The GCIB intensity may be modulated by any of a variety of methods, including varying the gas flow from a GCIB source supply; modulating the ionizer by either varying a filament voltage $V_F$ or varying an anode voltage $V_A$; modulating the lens focus by varying lens voltages $V_{L1}$ and/or $V_{L2}$; or mechanically blocking a portion of the beam with a variable beam block, adjustable shutter, or variable aperture. The modulating variations may be continuous analog variations or may be time modulated switching or gating.

Figure 2:
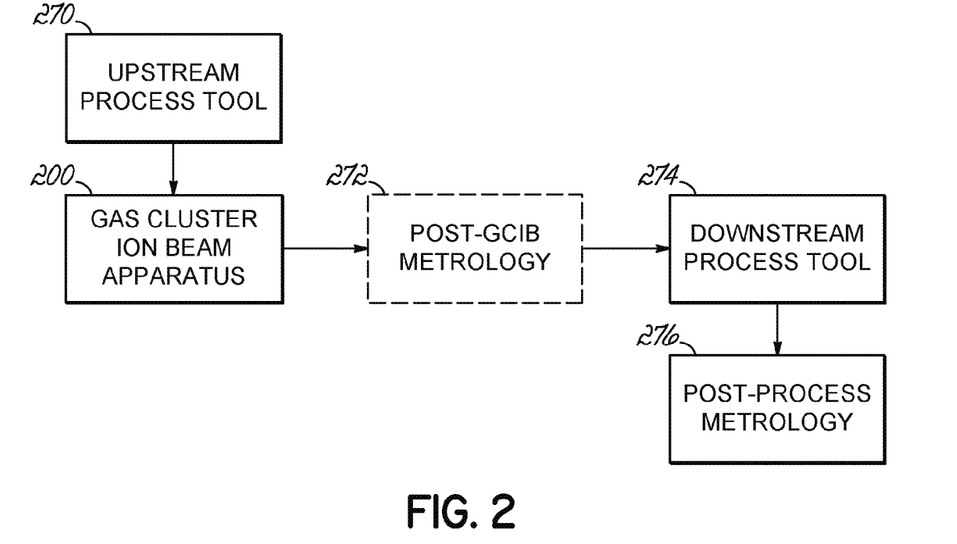
FIG. 2 is an illustration of one embodiment of a path traveled by a workpiece from an upstream process tool to a GCIB tool and, subsequently, from the GCIB tool to a downstream process tool.

With reference to FIG. 2 and in accordance with a representative embodiment, workpiece 210 is transferred in a path from an upstream process tool 270 to a downstream process tool 274. The workpiece 210 (FIG. 1) is processed by the upstream process tool 270, which may comprise a chemical vapor deposition tool, a sputtering tool, an atomic layer deposition tool, an electroplating tool, a diffusion tool, an ion implantation tool, an epitaxial tool, a lithography track tool, an etch tool, an ashing tool, a chemical mechanical polishing tool, a wafer clean tool, a rapid thermal processing tool, a metrology tool, or another workpiece processing tool. The processing in the upstream processing tool 270 modifies an upper layer of the workpiece 210. After processing in the upstream processing tool 270, the workpiece 210 is processed using the GCIB apparatus 200 for extremely shallow implantation, infusion, etching, decontamination, thin film or layer formation, or other process.

The workpiece 210 may be optionally analyzed using a post-GCIB metrology tool 272 to collect parametric data. For instance, if parametric data from the workpiece 210 before processing in the downstream process tool 274 is required to identify a differential in a property of the upper layer of the workpiece 210 before and after processing in the downstream process tool 274, then the post-GCIB metrology tool 272 is used to collect parametric data before downstream processing. In one embodiment, the post-GCIB metrology tool 272 is a film thickness metrology tool, such as a spectroscopic ellipsometer, scatterometer, interferometer, X-ray fluorescence tool, or a four-point probe. In another embodiment, the post-GCIB metrology tool 272 is a dosimetry measurement tool, such as a Thermawave THERMA-PROBE®, a four-point probe, or an optical densitometry tool. In a further embodiment, the post-GCIB metrology tool 272 is a surface contamination measurement tool such as an X-ray fluorescence, an X-ray diffraction, an X-ray reflectometry, or a time-of-flight mass spectrometry tool. In still another embodiment, the post-GCIB metrology tool 272 is a surface roughness measurement tool such as a profilometer, an atomic force microscope, an interferometer, or a scanning probe microscope.

The workpiece 210 is processed by a downstream process tool 274, such as a chemical vapor deposition tool, a sputtering tool, an atomic layer deposition tool, an electroplating tool, a diffusion tool, an ion implantation tool, an epitaxial tool, a lithography track tool, an etch tool, an ashing tool, a chemical mechanical polishing tool, a wafer clean tool, a rapid thermal processing tool, a metrology tool, or another workpiece processing tool before measurement by a post-process metrology tool 276. In one embodiment, the post-GCIB metrology tool 272 and the post-process metrology tool 276 are the same metrology tool. In another embodiment, the post-GCIB metrology tool 272 and the post-process metrology tool 276 are different tools or equipment.

Figure 3:
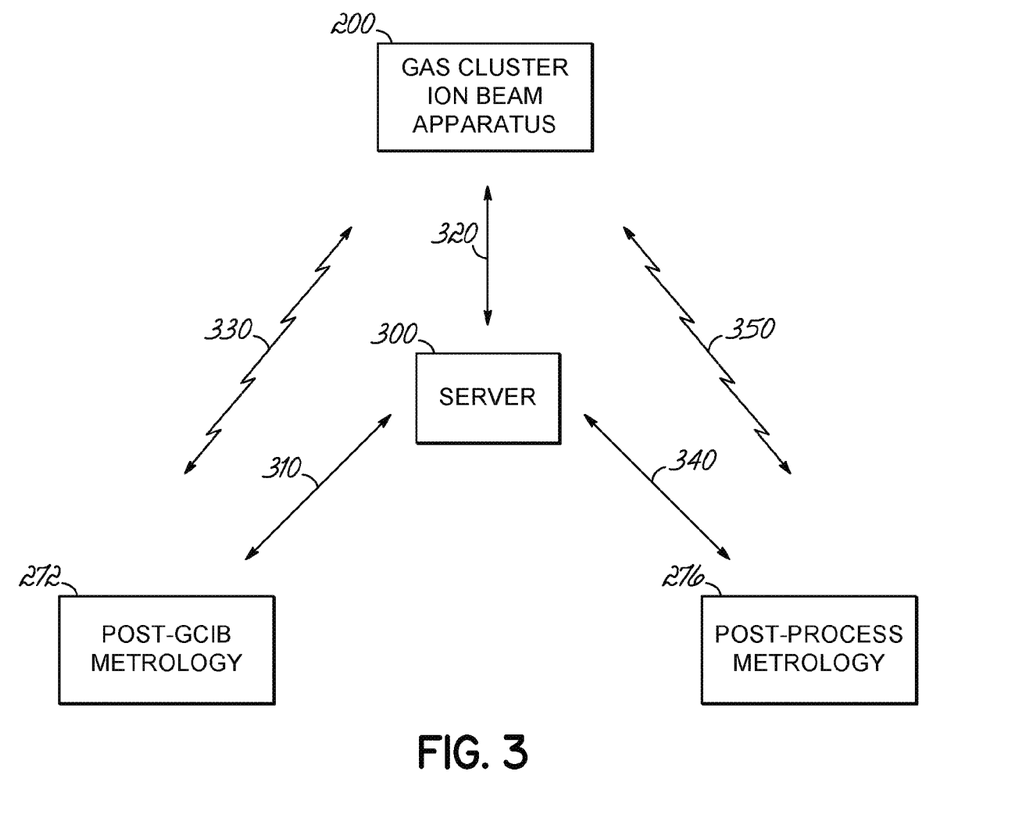
FIG. 3 is a diagrammatic view illustrating the interaction of a gas cluster ion beam apparatus with pre-process metrology and post-process metrology.

With reference to FIG. 3, the gas cluster ion beam apparatus 200, the post-GCIB metrology tool 272, and the post-process metrology tool 274 are configured to communicate with each other and with a host server 300. In the embodiment shown in FIG. 3, the post-GCIB metrology and post-process metrology tools 272, 274 are located ex-situ of the GCIB processing apparatus 200, which means that the metrology tools 272, 274 are separate from the GCIB processing apparatus 200. In another embodiment, the post-GCIB metrology tool 272 is located in-situ and, to that end, may be contained within the vacuum vessel 102 to allow for in-vacuum measurements on the GCIB processing apparatus 200. In yet another embodiment, the post-GCIB metrology tool 272 and post-process metrology tool 274 may be located in-situ outside the vacuum vessel 102 but still considered part of the GCIB processing apparatus 200. The post-GCIB metrology and post-process metrology tools 272, 274 may be separate equipment, if well matched, or they may be the same metrology equipment.

The post-GCIB metrology tool 272 and the post process metrology tool 274 may communicate with the GCIB processing apparatus 200 by electrical signals communicated through a wired interface, such as a SEMI Equipment Communications Standard/Generic Equipment Model (SECS/GEM) wired interface. A SECS/GEM communication is a wired protocol between a host server 300 and the GCIB processing apparatus 200, post-GCIB metrology tool 272, and post-process metrology tool 274, as well as with other semiconductor manufacturing tools or equipment (not shown). SECS is a layer 6 protocol that describes the content of the messages while GEM is a higher layer application protocol that defines the messages themselves. Alternatively, the wired interface over which the electrical signals are communicated between the host server 300, GCIB processing apparatus 200, post-GCIB metrology tool 272, and post-process metrology tool 274 may be a registered jack (RJ) standardized physical interface such an eight-pin Ethernet (8P8C) or two-pin (RJ-11) connector, or a universal serial bus (USB) interface, or an RS-232 serial binary data connection.

In one embodiment, a SECS/GEM communication is transferred between the gas cluster ion beam apparatus 200 and the post-GCIB metrology tool 272 over wired communication paths 310 and 320 via server 300. In another embodiment, the SECS/GEM communication is transferred between the GCIB processing apparatus 200 and the post-process metrology tool 274 through wired communication paths 320 and 340 via server 300. In a further embodiment, post-GCIB metrology tool 272 communicates with post-process metrology tool 274 through wired communication path 310 and 340 via server 300.

Alternatively, the GCIB processing apparatus 200 and post-GCIB metrology tool 272, and the GCIB processing apparatus 200 and post-process metrology tool 274 may be coupled in communication using short-range wireless technology connections 330, 350, respectively, characterized by respective transceiver interfaces. In one embodiment, the wireless connections 330, 350 may comprise a short-range wireless technology connection to limit interference with other processing equipment, although the invention is not so limited as to a long-range wireless connection may be used in an alternative embodiment. Short-range wireless technologies, such as Bluetooth wireless technology, may communicate data signals over a distance of up to 10 meters in a frequency range between 2.402 gigahertz (GHz) and 2.480 GHz. Bluetooth protocols are described in "Specification of the Bluetooth System: Core, Version 1.1," published Feb. 22, 2001 by the Bluetooth Special Interest Group, Inc. Associated, as well as previous or subsequent, versions of the Bluetooth standard may also be supported by the wireless connections 330, 350. Alternatively, the short-range wireless technology, such as ultra-wideband (UWB), may communicate digital data over a wide spectrum of frequency bands ranging in a frequency range between 3.1 GHz and 10.6 GHz. Other examples of a short-range wireless technology includes certified wireless universal serial bus (USB), and communications defined by the Institute of Electrical Institute of Electrical and Electronic Engineers (IEEE) 802.11, Wireless Fidelity (Wi-Fi) and IEEE 802.16 Worldwide Interoperability for Microwave Access (WiMAX) suites of standards. IEEE 802.11b corresponds to IEEE Std. 802.11b-1999 entitled "Local and Metropolitan Area Networks, Part 11: Wireless LAN Medium Access Control (MAC) and Physical Layer (PHY) Specifications: Higher-Speed Physical Layer Extension in the 2.4 GHz Band," approved Sep. 16, 1999 as well as related documents. IEEE 802.11g corresponds to IEEE Std. 802.11g-2003 entitled "Local and Metropolitan Area Networks, Part 11: Wireless LAN Medium Access Control (MAC) and Physical Layer (PHY) Specifications, Amendment 4: Further Higher Rate Extension in the 2.4 GHz Band," approved Jun. 27, 2003 as well as related documents.

In one embodiment, parametric data is transferred between the post-GCIB metrology tool 272 and the GCIB processing apparatus 200 to offset one or more downstream systematic non-uniformities in film thickness across the surface of a workpiece 210. According to this embodiment, film thickness map information is transferred to the GCIB processing apparatus 200 as a parametric data file. Using a previously measured beam removal function and a previously measured relationship between etch rate and dose for a particular set of GCIB parameters (including GCIB energy and cluster species), a mathematical algorithm is employed which takes the non-uniformity data, inverts a beam spot etching pattern to fit the non-uniformity profile, and creates a beam-dose contour as a systematic error offset to selectively remove surface material from workpiece 210 to offset systematic non-uniformities of a downstream process tool 274 (FIG. 2). Many different approaches to the selection of mathematical algorithm may be successfully employed in this embodiment. In another embodiment, the beam-dose contour may selectively deposit additional material as a systematic error response on the surface of the upper layer of workpiece 210 to offset systematic non-uniformities of a downstream process tool 274. The amount of material removed or added by GCIB processing is dose and energy dependent and with higher doses or energies, as much as several microns may be removed from a particular film surface, if required for smoothing or for adjusting the thickness of the film.

To a first approximation, a beam profile will be a Gaussian function for any cross-section slice of the beam 202 (FIG. 1) in cylindrical coordinates with the beam propagation axis as the Z-axis of the coordinate system. For the case of profiling by variations in the beam dwell time, the mathematical inversion and deconvolution that must be performed are simplified because the response function of the sample is linear with changes in dose. Hence, the beam removal function has essentially the same mathematical functional shape as the beam intensity profile. The beam dwell-time map, which directly determines the beam-scan pattern, must be implemented for each systematically varying film batch if angstrom-scale uniformity is desired. Once processed to GCIB specifications, the uniformity of the workpiece(s) may be examined either in-situ or ex-situ and the process finished or refined as appropriate.

Figure 4:
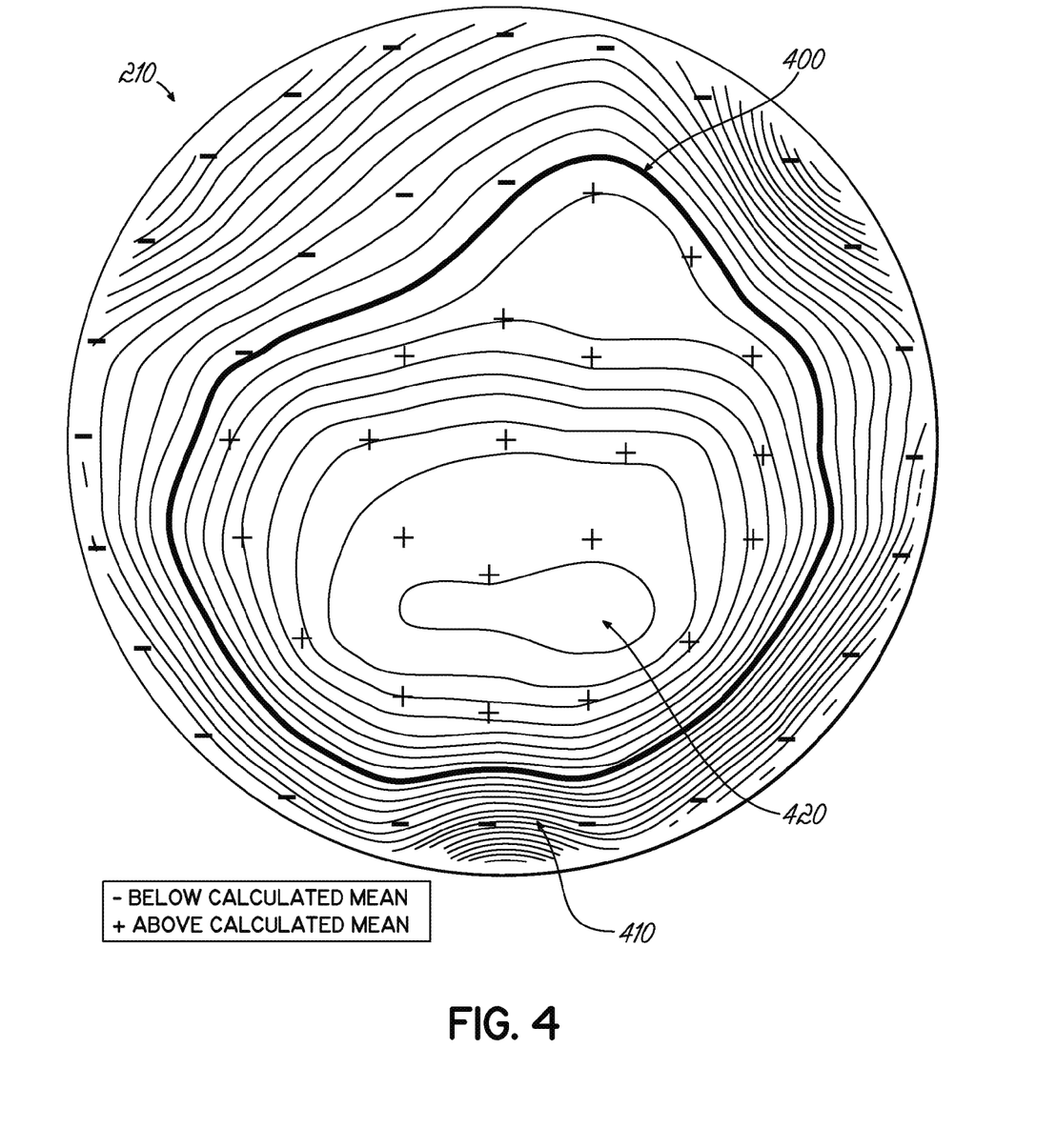
FIG. 4 is a diagrammatic view showing a spectroscopic ellipsometry film-thickness map of an upper layer on a workpiece.

The initial film-thickness non-uniformity of the upper layer on the workpiece 210 may be characterized in the post-GCIB metrology tool 272 (FIG. 2) ex-situ of the GCIB apparatus 200 (FIGS. 1-3) by spectroscopic ellipsometry or other suitable conventional techniques. Such techniques can produce a point-by-point film thickness map that may be reduced to thickness contours or another type of graphical or nongraphical presentation, as shown in FIG. 4. Similarly, an in-situ uniformity-mapping instrument in the post-GCIB metrology tool 272 (FIG. 2) using spectroscopic ellipsometry or other suitable conventional film thickness mapping techniques may be incorporated within the GCIB apparatus 200 for guiding a profiling process. In either case, the non-uniformity measurements may be stored as a series of thickness points with precise wafer positions by a standard computer. A film measurement method such as spectroscopic ellipsometry is used to map the thickness of only the top film layer, independent of variations in workpiece thickness, thickness of underlying films, or surface flatness.

FIG. 4 illustrates a film-thickness map of a wafer with an upper layer comprising a thin film or layer as measured by spectroscopic ellipsometry using a commercially available model UV-1280SE thin film measurement instrument manufactured by KLA-Tencor Corporation. As apparent from FIG. 4, the thickness of a thin film on a substrate or workpiece may be mapped as a function of position. Such measurements can be performed to within an accuracy and precision of a few angstroms. The upper layer on workpiece 210 (FIG. 1) has a thickness contour with a mean 400 and areas with decreased thickness 410 and increased thickness 420. The areas with decreased thickness 410 and increased thickness 420 may be systematic non-uniformities inherent to the process tool used. For example, systematic non-uniformities may arise from an architecture of a chemical vapor deposition process chamber in which incoming process gas is delivered to the center of the workpiece 210 and by-products are exhausted from the edge of the workpiece 210 near the area of decreased thickness 410.

Figure 5:
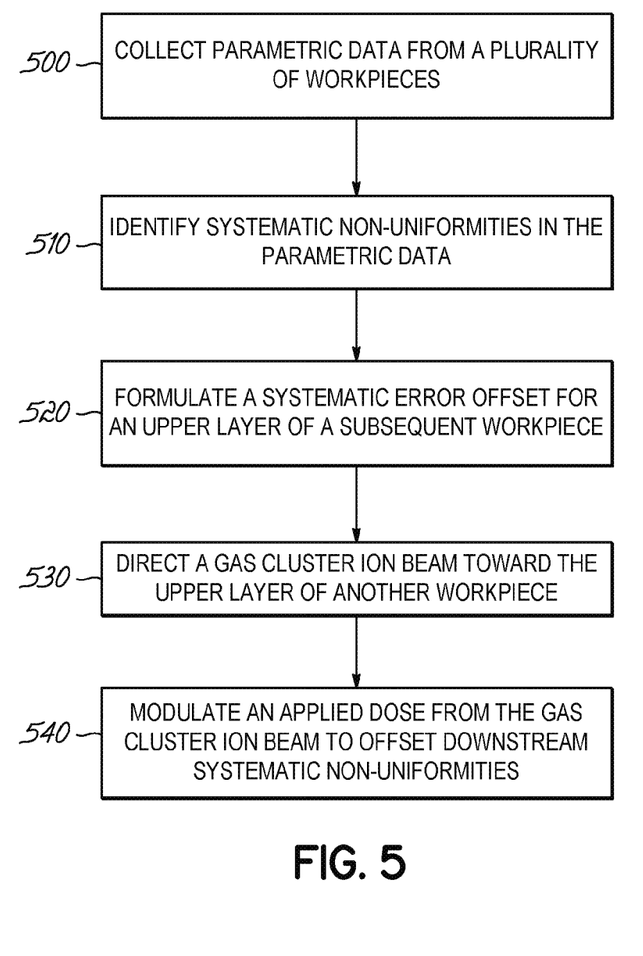
FIG. 5 is a flowchart showing one embodiment of a method of offsetting a systematic non-uniformity using a gas cluster ion beam.

With reference to FIG. 5 and in accordance with an embodiment, systematic non-uniformities introduced into an upper layer on one or more workpieces 210 (FIG. 1) by the downstream process tool 274 (FIGS. 2, 3) can be offset using a gas cluster ion beam, such as a GCIB 202 (FIG. 1) generated by the GCIB apparatus 200 (FIGS. 1-3). The offsetting is accomplished in a predictive manner so as to reduce the non-uniformities of the downstream process tool 274 (FIG. 2) that is downstream in the process line from the GCIB apparatus 200.

In block 500, parametric data from a plurality of workpieces 210 is collected. In one embodiment, the plurality of workpieces 210 may be a cassette of wafers with a thin film applied on a top surface of each wafer using a deposition processing tool. The parametric data may be data collected from a film thickness measurement tool using technologies such as spectroscopic ellipsometry, scatterometry, interferometry, X-ray fluorescence, or four point resistivity. In another embodiment, the parametric data may be data collected from a dosimetry measurement tool, such as a Thermawave Therma-Probe®, a four-point probe, or an optical densitometry tool. In a further embodiment, the parametric data may be data collected from a surface contamination measurement tool, such as an X-ray fluorescence tool, an X-ray diffraction tool, an X-ray reflectometry tool, or a time-of-flight (TOF) mass spectrometry tool. In still another embodiment, the parametric data may be data collected from a surface roughness measurement tool such as a profilometer, an atomic force microscope, an interferometer, or a scanning probe microscope.

In block 510, systematic non-uniformities are identified in the parametric data. In block 520, a systematic error offset is formulated for an upper layer of one or more subsequent workpieces 210. The systematic error offset may be generated using a previously measured beam removal function and a previously measured relationship between etch rate and dose for a particular set of GCIB parameters (including GCIB energy and cluster species), which employs a mathematical algorithm that takes the non-uniformity data, inverts a beam spot etching pattern to fit the non-uniformity profile, and creates a beam-dose contour to selectively remove surface material to offset systematic non-uniformities of a downstream process tool 274 (FIGS. 2, 3). A similar process may be employed to selectively deposit material using location specific processing. In block 530, the gas cluster ion beam is directed by GCIB apparatus 200 toward a surface of another subsequent workpiece 210. In block 530, an applied dose from the GCIB 202 (FIG. 1) is modulated to offset downstream systematic non-uniformities resulting from the processing of the workpieces 210 in the downstream process tool 274.

Figure 6:
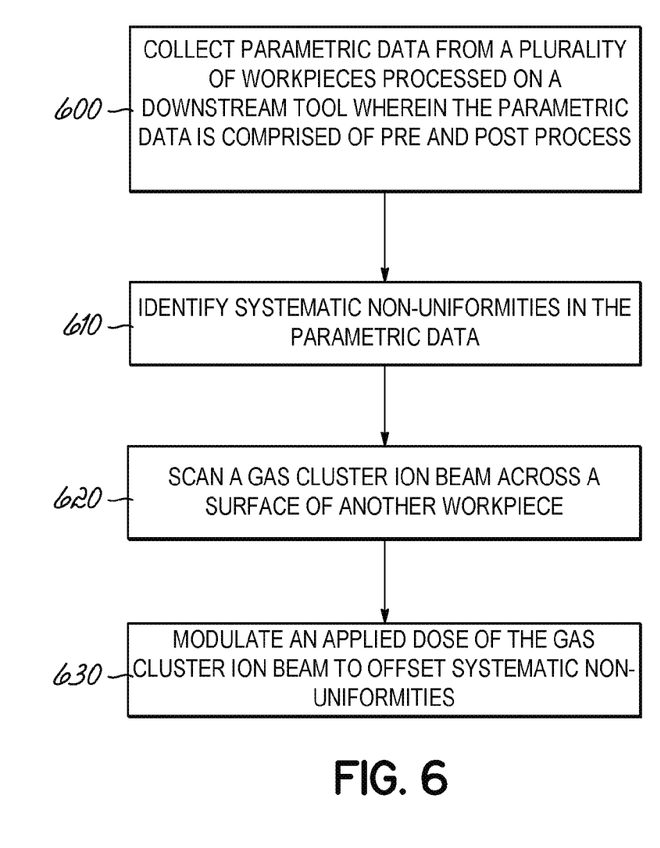
FIG. 6 is a flowchart showing another embodiment of a method of offsetting a systematic non-uniformity using a gas cluster ion beam.

With reference to FIG. 6 and in accordance with another embodiment, another method is provided for offsetting systematic non-uniformities using a gas cluster ion beam such as GCIB 202 (FIG. 1). In block 600, parametric data is collected from a plurality of workpieces processed on the downstream tool 274 (FIGS. 2, 3). The parametric data is collected from each of a plurality of workpieces 210 (FIG. 1), using one or more metrology tools, from before and after the plurality of workpieces 210 are processed on the downstream tool. In block 610, systematic non-uniformities are identified in the parametric data. In block 620, the GCIB 202 is scanned across an upper layer of another subsequent workpiece 210. In block 630, an applied dose delivered by the beam is modulated to offset downstream systematic non-uniformities in the upper layer of the subsequent workpiece 210.

Modulation represents an un-even application of dose to an upper layer of the workpiece 210 (FIG. 1) either through a change in scan speed of the X-Y positioning table 204 (FIG. 1) as the beam traverses the upper layer or through a change in intensity of the gas cluster ion beam. Either method may be used individually or in combination to modulate the applied dose.

To change the scan speed, the X-Y controller 216 (FIG. 1) maneuvers the X-Y positioning table 204 to position every part of the workpiece 210 for processing according to predetermined velocities that result appropriate beam dwell times to etch away or to deposit material to the desired thicknesses to correct for systematic non-uniformities and to provide a film of uniform thickness. This is one embodiment for modulating an applied dose of the GCIB 202 (FIG. 1). Alternatively, a beam is scanned at constant velocity in a fixed pattern across the surface, but the GCIB intensity is modulated (often referred to as Z-axis modulation) to deliver an intentionally non-uniform dose to the sample. This is another embodiment for modulating an applied dose of the GCIB 202. The GCIB intensity may be modulated by any or a variety of methods, including for example but not limited to: by varying a gas flow from the GCIB source supply; by modulating the ionizer of the GCIB processing apparatus 200 either by varying a filament voltage $V_F$, or by varying an anode voltage $V_A$; by modulating the lens focus by varying lens voltages $V_{L1}$ and/or $V_{L2}$ in the GCIB processing apparatus 200; or by mechanically blocking a portion of the beam by means of a variable beam block, adjustable shutter, or variable aperture. The modulating variations may be continuous analog variations or time modulated switching or gating.

A plurality of embodiments for offsetting systematic non-uniformities using a gas cluster ion beam has been described. The foregoing description of the embodiments of the invention has been presented for the purposes of illustration and description. It is not intended to be exhaustive or to limit the invention to the precise forms disclosed. This description and the claims following include terms, such as left, right, top, bottom, over, under, upper, lower, first, second, etc. that are used for descriptive purposes only and are not to be construed as limiting. For example, terms designating relative vertical position refer to a situation where a device side (or active surface) of a substrate or upper layer is the "top" surface of that substrate; the substrate may actually be in any orientation so that a "top" side of a substrate may be lower than the "bottom" side in a standard terrestrial frame of reference and still fall within the meaning of the term "top." The term "on" as used herein (including in the claims) does not indicate that a first layer "on" a second layer is directly on and in immediate contact with the second layer unless such is specifically stated; there may be a third layer or other structure between the first layer and the second layer on the first layer. The embodiments of a device or article described herein can be manufactured, used, or shipped in a number of positions and orientations.

In the description and claims, the terms "coupled" and "connected," along with their derivatives, are used. It should be understood that these terms are not intended as synonyms for each other. Rather, in particular embodiments, "connected" may be used to indicate that two or more elements are in direct physical or electrical contact with each other while "coupled" may further mean that two or more elements are not in direct contact with each other, but yet still co-operate or interact with each other.

Reference throughout this specification to "one embodiment" or "an embodiment" means that a particular feature, structure, material, or characteristic described in connection with the embodiment is included in at least one embodiment of the invention, but do not denote that they are present in every embodiment. Thus, the appearances of the phrases "in one embodiment" or "in an embodiment" in various places throughout this specification are not necessarily referring to the same embodiment of the invention. Furthermore, the particular features, structures, materials, or characteristics may be combined in any suitable manner in one or more embodiments. Various additional layers and/or structures may be included and/or described features may be omitted in other embodiments.

Various operations will be described as multiple discrete operations in turn, in a manner that is most helpful in understanding the invention. However, the order of description should not be construed as to imply that these operations are necessarily order dependent. In particular, these operations need not be performed in the order of presentation. Operations described may be performed in a different order than the described embodiment. Various additional operations may be performed and/or described operations may be omitted in additional embodiments.

Persons skilled in the relevant art can appreciate that many modifications and variations are possible in light of the above teaching. Persons skilled in the art will recognize various equivalent combinations and substitutions for various components shown in the Figures. It is therefore intended that the scope of the invention be limited not by this detailed description, but rather by the claims appended hereto.

What is claimed is:

1. A method of using a gas cluster ion beam to offset systematic non-uniformities in workpieces processed in a process tool, the method comprising:
   processing a plurality of first workpieces in the process tool;
   collecting parametric data from the first workpieces;
   identifying systematic non-uniformities in the collected parametric data;
   formulating a systematic error offset effective to reduce the identified systematic non-uniformities;
   directing the gas cluster ion beam toward a second workpiece before the second workpiece is processed by the process tool;
   spatially modulating an applied dose of the gas cluster ion beam, based at least in part on the systematic error offset, as a function of position on the second workpiece to offset the systematic non-uniformities projected to occur in the second workpiece when the second workpiece is processed by the process tool; and
   processing the second workpiece using the process tool.

2. The method of claim 1, wherein the systematic non-uniformities are selected from the group consisting of film thickness, surface roughness, and surface contamination.

3. The method of claim 1, further comprising:
   collecting parametric data from the second workpiece processed with the gas cluster ion beam before the second workpiece is processed by the process tool.

4. The method of claim 1, wherein collecting the parametric data further comprises:
   analyzing each of the first workpieces using a metrology tool selected from the group consisting of a spectroscopic ellipsometer, scatterometer, interferometer, X-ray fluorescence tool, and a four point probe.

5. The method of claim 1, wherein directing the gas cluster ion beam toward the second workpiece further comprises:
   generating gas clusters from a process gas selected from the group consisting of helium, neon, argon, krypton, xenon, nitrogen, oxygen, carbon dioxide, sulfur hexafluoride, nitric oxide, nitrous oxide, and mixtures thereof; and
   ionizing the gas clusters to generate the gas cluster ion beam.

6. The method of claim 1, wherein directing the gas cluster ion beam toward the second workpiece further comprises:
   implanting ions from the gas cluster ion beam into an upper layer of the second workpiece, infusing ions from the gas cluster ion beam into the upper layer of the second workpiece, etching the upper layer of the second workpiece, decontaminating the upper layer of the second workpiece, or depositing a film on the upper layer of the second workpiece.

7. The method of claim 1, wherein collecting parametric data further comprises:
   generating a first metrology map for each of the first workpieces before processing in the process tool; and
   generating a second metrology map for each of the first workpieces after processing in the process tool.

8. The method of claim 7, wherein identifying systematic non-uniformities further comprises:
   comparing the first and second metrology maps for each of the first workpieces to identify the systematic non-uniformities.

9. The method of claim 1, wherein spatially modulating the applied dose of the gas cluster ion beam further comprises:
   moving the second workpiece relative to the gas cluster ion beam with a dwell time at each position determined at least in part by the systematic error offset.

10. The method of claim 1, wherein spatially modulating the applied dose of the gas cluster ion beam further comprises:
    moving the second workpiece relative to the gas cluster ion beam; and
    adjusting an intensity of the gas cluster ion beam at each position on the second workpiece and determined at least in part by the systematic error offset to spatially modulate the applied dose.

11. The method of claim 1, wherein spatially modulating the applied dose of the gas cluster ion beam further comprises:
    moving the gas cluster ion beam relative to the second workpiece with a dwell time at each position determined at least in part by the systematic error offset.

12. A method of offsetting systematic non-uniformities using a gas cluster ion beam, the method comprising:

generating a first metrology map for each of a plurality of first workpieces;

processing the plurality of first workpieces are processed with a process tool;

generating a second metrology map for each of the plurality of first workpieces after processing with the process tool;

identifying systematic non-uniformities from parametric data by comparing the first and second metrology maps for each of the plurality of first workpieces;

scanning the gas cluster ion beam across an upper layer of a second workpiece before the second workpiece is processed by the process tool;

spatially modulating an applied dose of the scanned gas cluster ion beam as a function of position on the second workpiece to offset systematic non-uniformities projected to occur in the upper layer of the second workpiece before the second workpiece is processed in the process tool; and processing the second workpiece in the process tool.

13. The method of claim 12, wherein the non-uniformities are selected from the group consisting of film thickness, surface roughness, and surface contamination.

14. The method of claim 12, further comprising:

collecting parametric data from the second workpiece processed with the gas cluster ion beam.

15. The method of claim 12, wherein the first and second metrology maps are collected using a metrology tool selected from the group consisting of a spectroscopic ellipsometer, scatterometer, interferometer, X-ray fluorescence tool, and a four point probe.

16. The method of claim 12, further comprising:

generating gas clusters from a process gas selected from the group consisting of helium, neon, argon, krypton, xenon, nitrogen, oxygen, carbon dioxide, sulfur hexafluoride, nitric oxide, nitrous oxide, and mixtures thereof; and ionizing the gas clusters to generate the gas cluster ion beam.

17. The method of claim 12, wherein scanning the gas cluster ion beam across the second workpiece further comprises:

implanting ions from the gas cluster ion beam into an upper layer of the second workpiece, infusing ions from the gas cluster ion beam into the upper layer of the second workpiece, etching the upper layer of the second workpiece, decontaminating the upper layer of the second workpiece, or depositing a film on the upper layer of the second workpiece.

18. A processing system for use with a process tool and a metrology tool, the process tool configured to process a plurality of workpieces, the metrology tool configured to map a parameter of an upper layer on each of the processed workpieces and to generate parametric data representing the mapped parameter, the processing system comprising:

a gas cluster ion beam apparatus; and a controller coupled in communication with the gas cluster ion beam apparatus and adapted to be coupled in communication with the metrology tool, the controller being configured to receive the parametric data from the metrology tool, to generate control signals for operation of the gas cluster ion beam apparatus that are based upon the parametric data received from the metrology tool, and to communicate the control signals to the gas cluster ion beam apparatus.

19. The processing system of claim 18, wherein a gas cluster ion beam apparatus including a vacuum enclosure, a source configured to produce a gas cluster ion beam inside the vacuum enclosure, and a workpiece support in the vacuum enclosure.

20. The processing system of claim 19, wherein the workpiece support includes an X-Y positioning table.

21. The processing system of claim 19, wherein the controller is configured to identify systematic non-uniformities in the parametric data and to generate the control signals based at least partially on the systematic non-uniformities for spatially modulating an applied dose of the gas cluster ion beam as a function of position on a workpiece supported by the workpiece support.

22. The processing system of claim 19, wherein the gas cluster ion beam apparatus further comprises:

a plurality of scan plates; and a scan generator electrically coupled with the scan plates, the scan generator configured to apply voltages to the scan plates for varying a path of the gas cluster ion beam relative to the workpiece support.

23. The processing system of claim 19, wherein the source is a reactive source.

24. The processing system of claim 18, wherein the parametric data includes at least one of post-tool processing data or post-gas cluster ion beam apparatus processing data.

25. The processing system of claim 24, wherein the parametric data comprises film thickness data.

* * * * *

UNITED STATES PATENT AND TRADEMARK OFFICE
CERTIFICATE OF CORRECTION

PATENT NO.         : 7,550,749 B2
APPLICATION NO.    : 11/694572
DATED              : June 23, 2009
INVENTOR(S)        : Caliendo et al.

It is certified that error appears in the above-identified patent and that said Letters Patent is hereby corrected as shown below:

Title page, item [75] Inventors:
replace "Nicholas J. Hofmeester"
with -- Nicolaus J. Hofmeester --

Signed and Sealed this
Twenty-sixth Day of February, 2013

Teresa Stanek Rea
*Acting Director of the United States Patent and Trademark Office*